(12) United States Patent
Chew et al.

(10) Patent No.: US 7,151,418 B1
(45) Date of Patent: Dec. 19, 2006

(54) METHOD AND AN APPARATUS TO BIAS A CHARGE PUMP IN A PHASE LOCKED LOOP TO COMPENSATE A VCO GAIN

(75) Inventors: Chwei-Po Chew, Cupertino, CA (US); Paul H. Scott, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 11 days.

(21) Appl. No.: 10/923,409

(22) Filed: Aug. 20, 2004

Related U.S. Application Data

(60) Provisional application No. 60/506,636, filed on Sep. 25, 2003.

(51) Int. Cl.
*H03L 7/099* (2006.01)

(52) U.S. Cl. .................. 331/185; 331/176; 331/44; 327/157

(58) Field of Classification Search .............. 331/185, 331/176, 44, 16; 327/157
See application file for complete search history.

(56) References Cited

U.S. PATENT DOCUMENTS

| | | | |
|---|---|---|---|
| 4,970,472 A * | 11/1990 | Kennedy et al. ............ 331/8 |
| 5,179,555 A * | 1/1993 | Videlock et al. ............ 370/402 |
| 5,355,097 A | 10/1994 | Scott et al. | |
| 5,745,011 A | 4/1998 | Scott | |
| 5,896,068 A | 4/1999 | Moyal | |
| 5,952,888 A | 9/1999 | Scott | |
| 6,084,479 A | 7/2000 | Duffy et al. | |
| 6,177,843 B1 | 1/2001 | Chou et al. | |
| 6,351,168 B1 | 2/2002 | Li et al. | |
| 6,373,302 B1 | 4/2002 | Li et al. | |
| 6,373,341 B1 * | 4/2002 | Morgan ..................... 331/57 |
| 6,628,171 B1 | 9/2003 | Chou et al. | |
| 2002/0041215 A1 * | 4/2002 | Kiyose ..................... 331/57 |
| 2003/0020526 A1 * | 1/2003 | Ingino ...................... 327/157 |

* cited by examiner

*Primary Examiner*—Joseph Chang
(74) *Attorney, Agent, or Firm*—Blakely, Sokoloff, Taylor & Zafman LLP

(57) ABSTRACT

A method and an apparatus to bias a charge pump in a phase locked loop (PLL) to compensate a voltage controlled oscillator (VCO) gain have been disclosed. One embodiment of the apparatus includes a PLL comprising a charge pump, the charge pump comprising an input and an output, and a bias circuit coupled to the input of the charge pump, the bias circuit comprising a sensor circuit to sense a temperature and at least one of a voltage and a process variation and a current reference circuit coupled to the sensor circuit.

15 Claims, 13 Drawing Sheets simulation waveforms. Vp and MOS gate voltage after low pass filter (top), the desired current (bottom).

US 7,151,418 B1

METHOD AND AN APPARATUS TO BIAS A CHARGE PUMP IN A PHASE LOCKED LOOP TO COMPENSATE A VCO GAIN

REFERENCE TO RELATED APPLICATION

This application claims the benefit of U.S. Provisional Application No. 60/506,636, filed on Sep. 25, 2003.

FIELD OF INVENTION

The present invention relates generally to integrated circuits, and more particularly, to phase locked loops (PLL).

BACKGROUND

In electronic systems, good clock distribution is very important to the overall performance of the electronic systems in general. Unwanted clock skew and jitter typically result from poor clock distribution and cause problems in the design and operation of the electronic systems. Techniques have been developed using PLLs to mitigate the effect of these problems to manageable levels. Therefore, PLLs are widely used in electronic circuits.

FIG. 1A shows a conventional PLL. The PLL 100 comprises a phase frequency detector (PFD) 110, a filter 120, a voltage controlled oscillator (VCO) 130, and a feedback divider 140. The filter 120 may include a charge pump and a loop filter. The inputs to the PFD 110 comprise a reference clock signal 101 and a feedback clock signal 103. The output of the PFD 110 comprises the frequency and phase of the reference signal 101 relative to the feedback clock signal 103, and is input to the filter 120. The filter 120 integrates this information into a voltage output. The voltage output of the filter 120 is provided to the VCO 130. The VCO 130 converts the output voltage from the filter 120 into an output signal having a corresponding frequency. The output of the VCO 130 is coupled to the feedback divider 140. The feedback divider 140 divides down the frequency of the output signal from the VCO 130, which becomes the feedback clock signal 103. The PFD 110 compares the feedback clock signal 103 with the reference clock signal 101.

FIG. 1B shows another conventional PLL 102. The VCO gain variation is compensated by a compensation circuit 22 with a pre-set input control voltage, $V_{CONTROL}$. The input control voltage is pre-set by the designer of the circuit.

FIG. 1C illustrates the existing VCO gain compensation graphically. As shown in FIG. 1C, the VCO gain 151 decreases as temperature changes from minus 55° C. to plus 155° C. By applying a compensation current 152 with an opposite trend, the overall VCO gain 153 across temperature variation is reduced.

One disadvantage of conventional technology is the inflexibility of the design. Since a pre-determined voltage level is used, the design is less flexible than it could otherwise be. In addition, the conventional solution described above compensates for VCO gain variation caused only by temperature variation. No compensation for VCO gain variation due to process variation and/or voltage variation is provided.

In a conventional clock domain recovery (CDR) PLL, the PLL gains are determined by one or more of the input data transition density, which may have a 20× variation, the charge pump current, which may have a 1.8× variation, the loop filter gain, which may have a 2× variation, and the VCO gain, which may have a 5× variation. The variations in these parameters may be caused by the mismatches in any one or more of the process variation, the temperature, and the voltage.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly couple and to indirectly couple.

Figure 2:
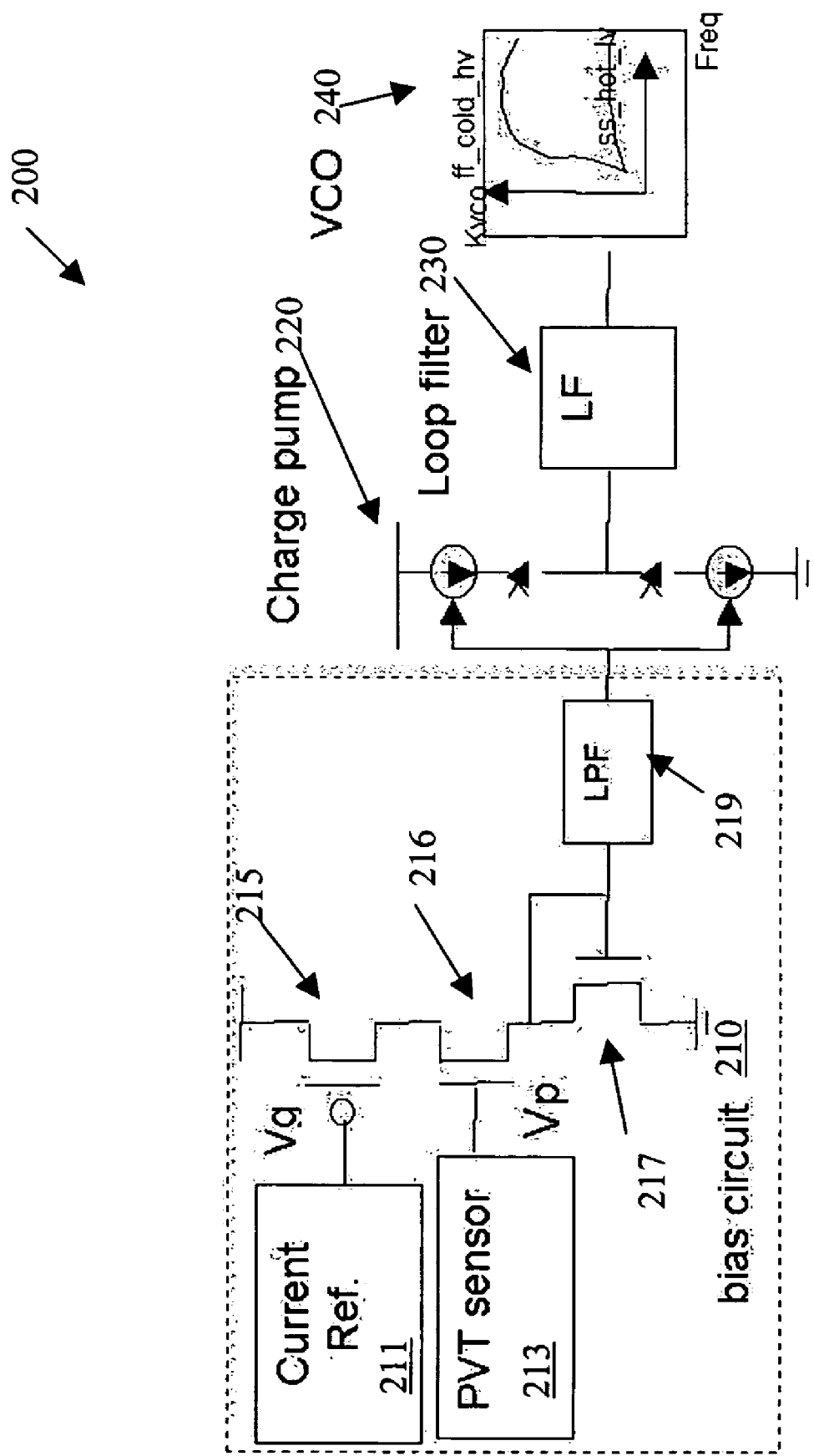
FIG. 2 shows one embodiment of a PLL.

FIG. 2 shows one embodiment of a phase locked loop (PLL). The PLL 200 includes a bias circuit 210, a charge pump 220, a loop filter (LF) 230, and a voltage controlled oscillator (VCO) 240. The bias circuit 210 is coupled to an input of the charge pump 220. An output of the charge pump 220 is coupled to an input of the LF 230. An output of the LF 230 is coupled to an input of the VCO 240.

Note that any or all of the components and the associated hardware illustrated in FIG. 2 may be used in various embodiments of the PLL 200. However, it should be appreciated that other configurations of the PLL 200 may include more or less devices than those shown in FIG. 2.

In one embodiment, the bias circuit 210 further includes a current reference circuit 211, a sensor circuit 213, a p-type Metal Oxide Semiconductor (pMOS) transistor 215, two n-type Metal Oxide Semiconductor (nMOS) transistors 216 and 217, and a low pass filter (LPF) 219. An output of the current reference circuit is coupled to the gate of the pMOS transistor 215. Likewise, an output of the sensor circuit 213, Vp, is coupled to the gate of the nMOS transistor 216. The source of the pMOS transistor 215 is coupled to a voltage supply. The drain of the pMOS transistor 215 is coupled to the drain of the NMOS transistor 216. The source of the nMOS transistor 216 is coupled to both the drain and the gate of the other nMOS transistor 217. The source of the NMOS transistor 217 is grounded. The gate of the NMOS transistor 217 is coupled to an input of the LPF 219.

In some embodiments, the gain of the VCO 240 has wide variation that affects the performance of the PLL 200. The bias circuit 210 may generate a bias current for the charge pump 220 to compensate the VCO gain variation across a temperature and at least one of a process variation and a voltage. The mismatch across process variation, voltage, and temperature is commonly referred to as the PVT mismatch. The bias circuit 210 may convert Vp into a charge pump biasing current by switching the reference current circuit 211 and passing through the LPF 219 to create the charge pump bias current.

When power-on resets the PLL 200, the charge pump 220 may operate with a default set bias current in order to get the PLL 200 to start running. After the junction temperature of the devices in the PLL 200 becomes substantially steady, the bias circuit 210 may start to provide PVT compensated bias current for the charge pump 220.

Figure 3:
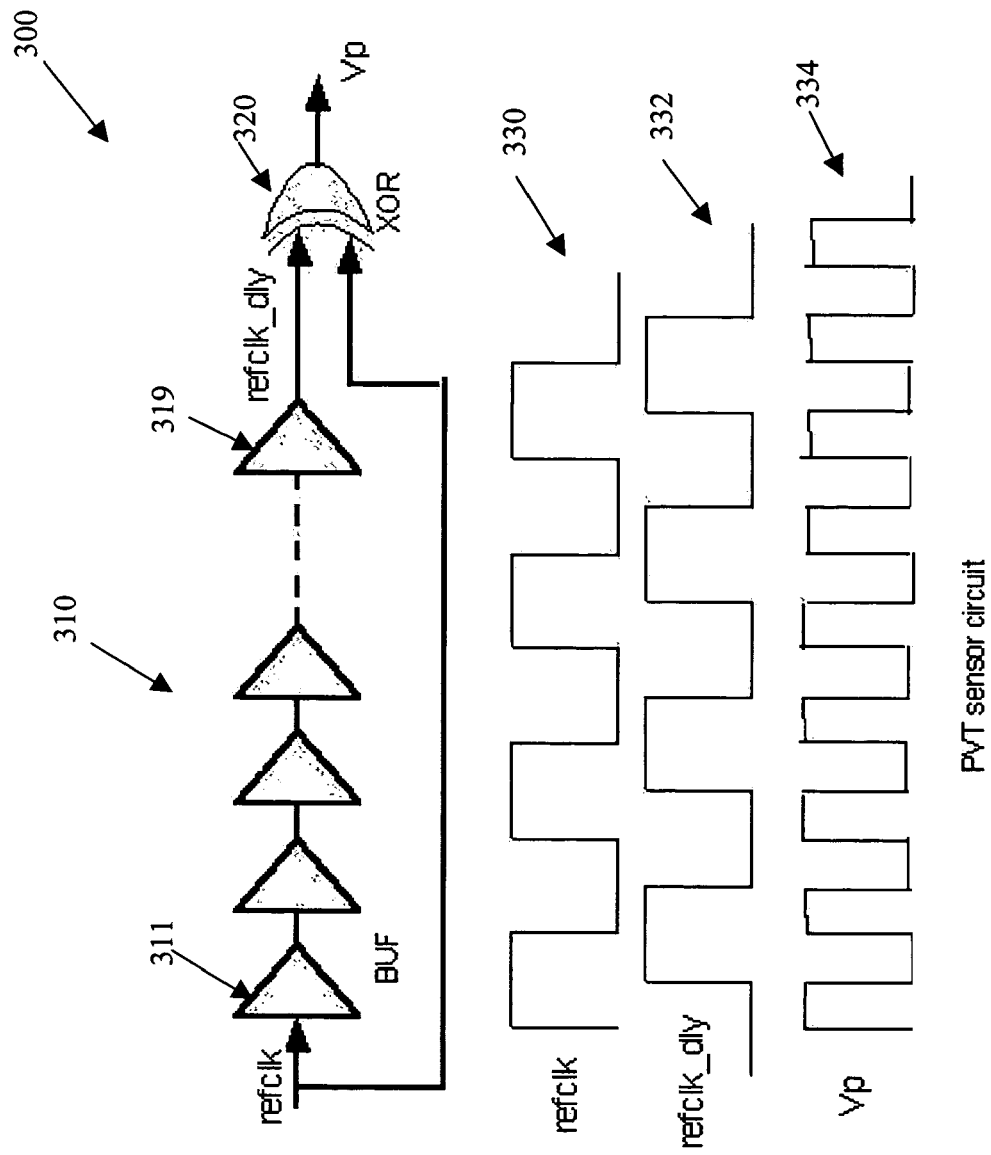
FIG. 3 shows one embodiment of a sensor circuit.

FIG. 3 illustrates one embodiment of a sensor circuit. The sensor circuit 300 includes a predetermined number of buffer gates 310 and an exclusive-OR (XOR) gate 320. The buffer gates are coupled to each other in series. The first buffer gate 311 in the series receives a reference clock signal (refclk). In one embodiment, refclk is chosen from a reference external to the PLL 200 to provide an initial reference value. The external reference may or may not reside on the same integrated circuit substrate with the PLL 200. The output of the last buffer gate 319 in the series is coupled to a first input of the XOR gate 320. A second input of the XOR gate 320 receives refclk. The output of the XOR gate 320 is Vp.

In one embodiment, refclk propagates through the series of buffer gates 310 to the XOR gate 320. The buffer gates 310 form a delay chain to delay refclk. The delay chain may be a replica of the cells in the VCO 240 of the PLL 200 (referring to FIG. 2). Thus, the delay of refclk due to the buffer gates 310 may substantially correlate with the delay of signals in the VCO 240. The delay of signals in the VCO 240 may be caused by at least one of a process variation, a voltage, and a temperature. Since the delay of signals in the VCO 240 correlates with the gain of the VCO 240, the delay of refclk due to the buffer gates 310 correlates with the gain of the VCO 240. Furthermore, as mentioned above, the gain of the VCO 240 may fluctuate due to the delay of signals in the VCO 240 caused by at least one of a process variation, a voltage, and a temperature. Therefore, the sensor circuit 300 may also be referred to as a PVT sensor circuit.

A sample waveform 330 of refclk and a sample waveform 332 of the delayed refclk (refclk_dly) are shown underneath the sensor circuit 300 in FIG. 3. As refclk_dly and refclk are input to the XOR gate 320, the XOR gate 320 performs XOR operation such that the delay between refclk and refclk_dly corresponds to the pulse width of the output signal of the XOR gate 320, i.e., Vp. A sample waveform 334 of Vp corresponding to the sample refclk waveform 330 and the sample refclk_dly waveform 332 is shown in FIG. 3. As illustrated in FIG. 3, Vp is a pulse width modulated (PWM) signal having a high state pulse width tracking the VCO gain. For example, the VCO delay cells have longer delay at a slow/hot/low voltage corner (ss_hot_lv) than a fast/cold/high voltage corner (ff_cold_hv). Therefore, the high state pulse width of Vp is wider in ss_hot_lv corner than ff_cold_hv corner. In one embodiment, Vp is coupled to the gate of the nMOS transistor 216 as shown in FIG. 2.

Figure 4:
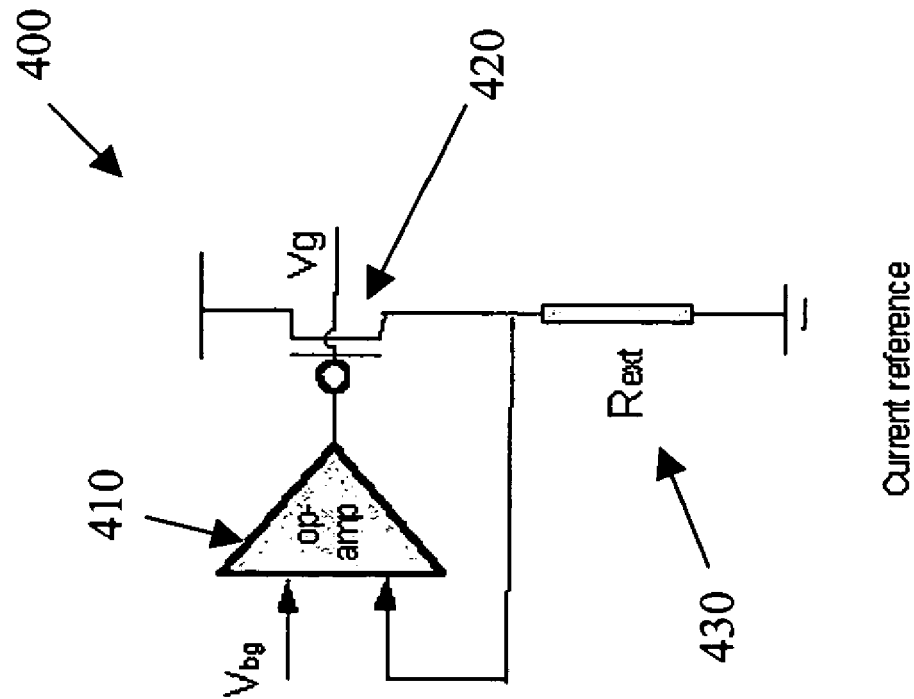
FIG. 4 shows one embodiment of a current reference circuit.

FIG. 4 illustrates one embodiment of a current reference circuit. The current reference circuit 400 includes an operational amplifier (op-amp) 410, a pMOS transistor 420, and a resistor 430. One input of the op-amp 410 receives a bandgap voltage, Vbg. The bandgap voltage may be approximately 1.2V. The output of the op-amp 410, Vg, is coupled to the gate of the pMOS transistor 420 to drive the pMOS transistor 420. The source of the pMOS transistor is coupled to a voltage supply and the drain of the pMOS transistor 420 is coupled to the other input of the op-amp 410 to provide a feedback to the op-amp 410. The drain of the pMOS transistor 420 is also coupled via the resistor 430 to the ground. The resistor 430 may include an external resistor having characteristics substantially insensitive to PVT mismatches. The output of the op-amp 410, Vg, drives the gate of the pMOS transistor 215 in FIG. 2. Therefore, the mirrored current may remain substantially constant across PVT.

Figure 1A:
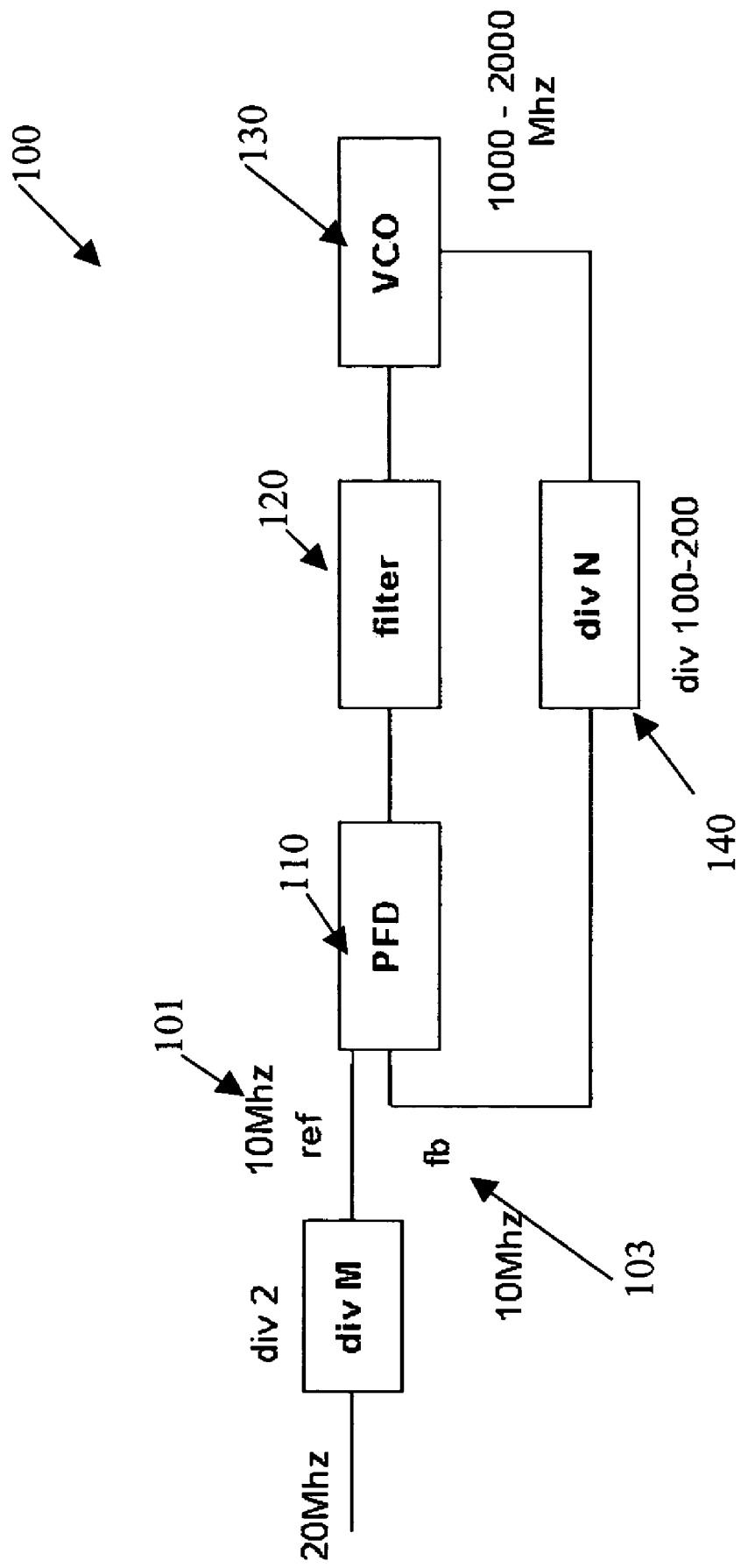
FIG. 1A shows a conventional phase locked loop (PLL).
Figure 1B:
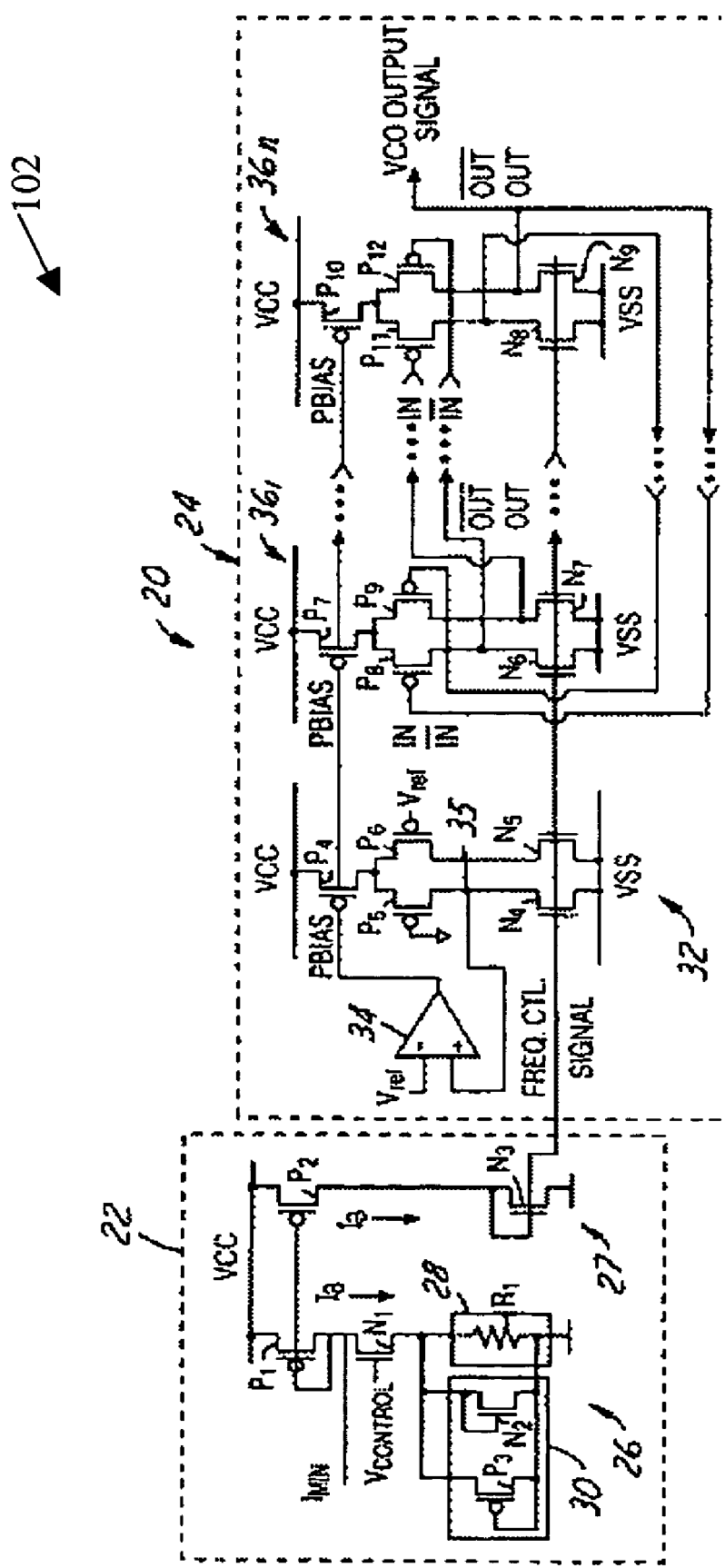
FIG. 1B shows another conventional PLL.
Figure 1C:
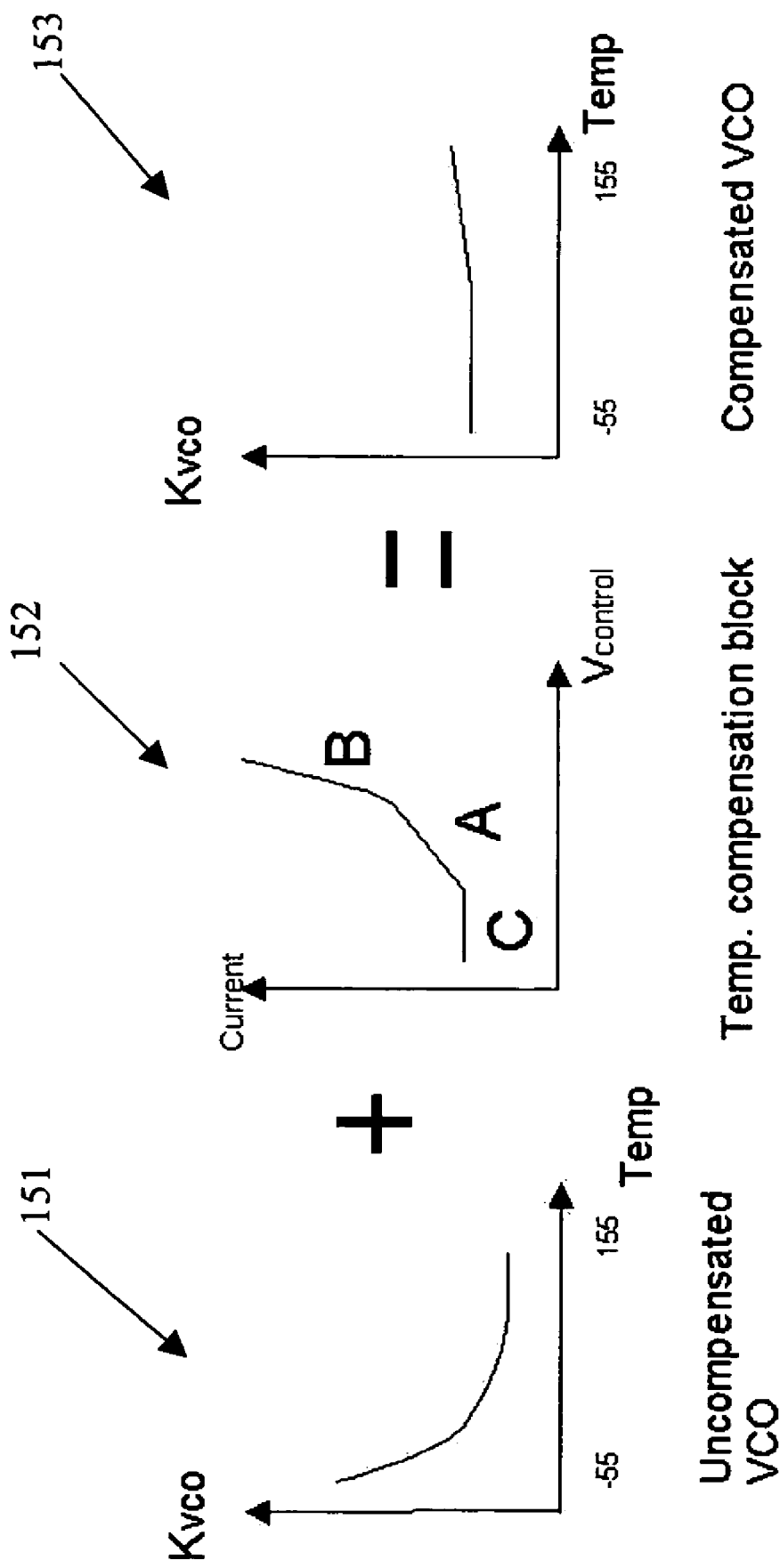
FIG. 1C illustrates the compensation of a gain of a voltage-controlled oscillator (VCO) graphically.

Embodiments of the PLL 200 described above provide compensation to the gain of the VCO 240 caused by a temperature and at least one of a process variation and a voltage. In contrast, the conventional design shown in FIG. 1C provides compensation to the VCO gain caused by only temperature. Furthermore, the technique disclosed above is applicable to different types of charge pump (e.g., a Gm transconductance cell) and different types of VCO in a PLL. Moreover, the bias circuit 210 may be configured as a circuit block separated from the other components of the PLL 200. Therefore, the bias circuit 210 is suitable for block-based circuit design that allows quicker time-to-market product cycles and rapid integration into existing designs of PLLs.

Figure 5A:
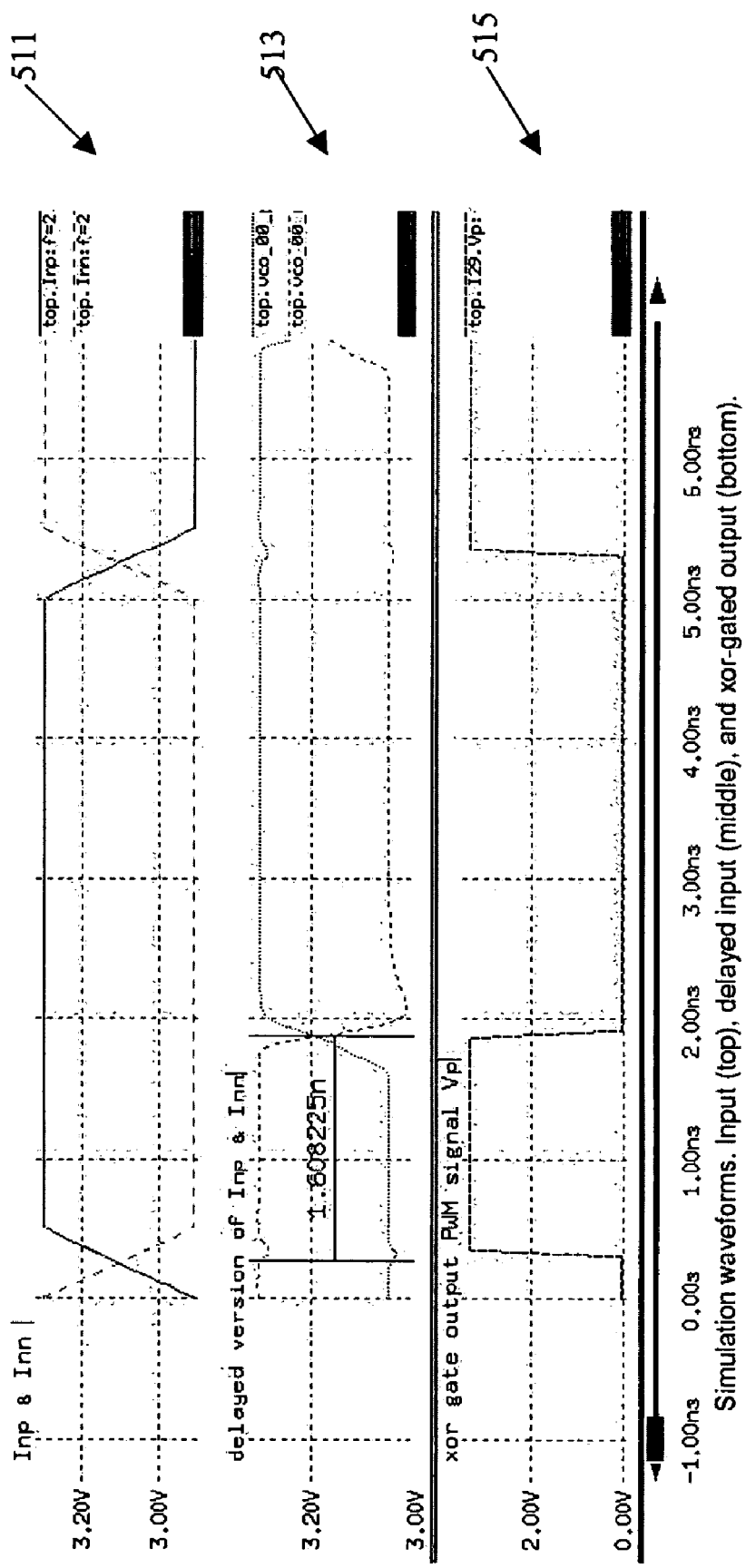
FIGS. 5A–5E show sample waveforms and results of simulation of exemplary embodiments of a PLL.
Figure 5B:
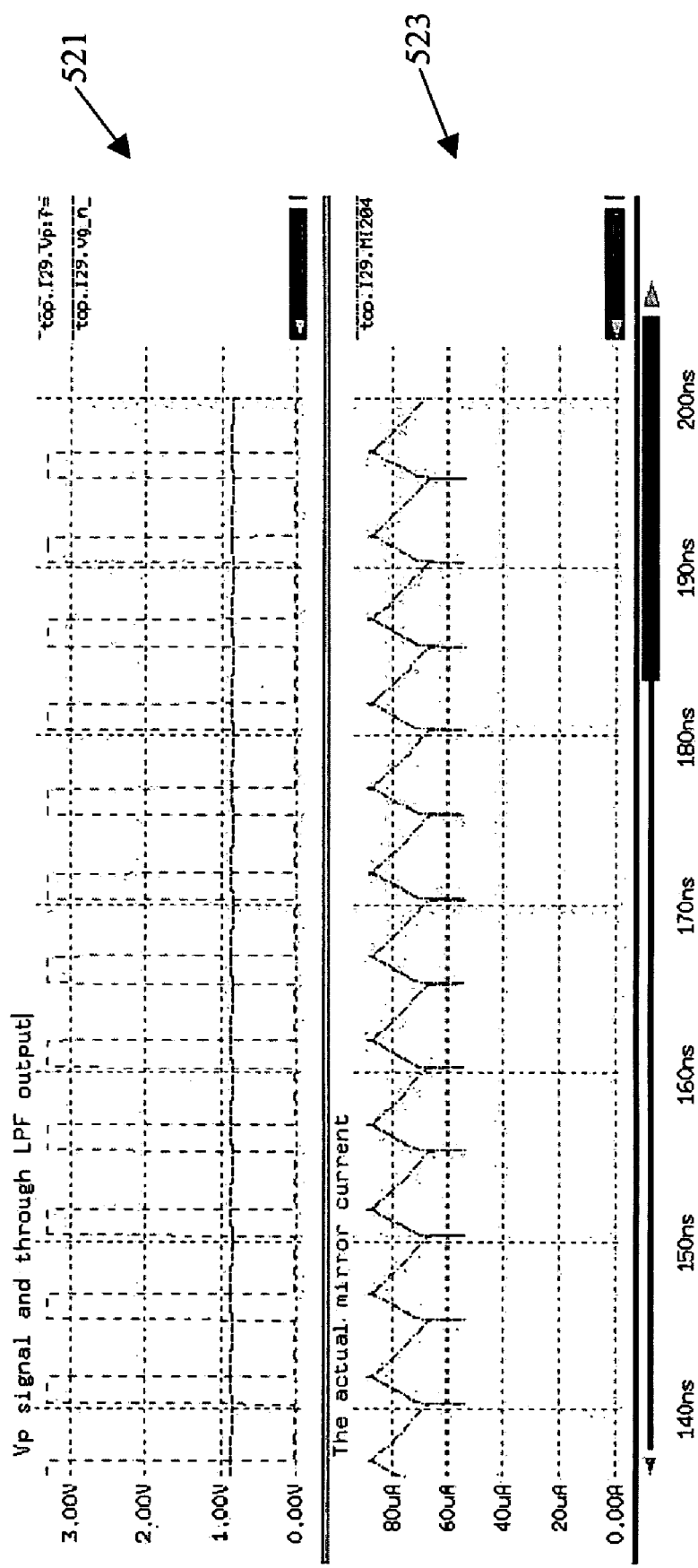

FIGS. 5A–5E shows exemplary simulation results of one embodiment of the PLL. FIGS. 5A and 5B show some exemplary simulation waveforms. In FIG. 5A, the differential input (Inp, Inn) waveforms 511 are shown on top. The middle waveform 513 is the delayed input waveform. The bottom waveform 515 is the XOR gate output of the waveforms 511 and 513.

FIG. 5B shows an exemplary waveform of Vp 521 (i.e., the output voltage of the sensor circuit 213 in FIG. 2) and Vp through the LPF 219 in FIG. 2. An exemplary waveform 523 of a bias current for the charge pump 220 is shown on the bottom of FIG. 5B. In one embodiment, the ripple in the waveform 523 in FIG. 5B may be reduced by increasing the magnitude of a resistive-capacitive (R–C) element in the LPF 219.

Figure 5C:
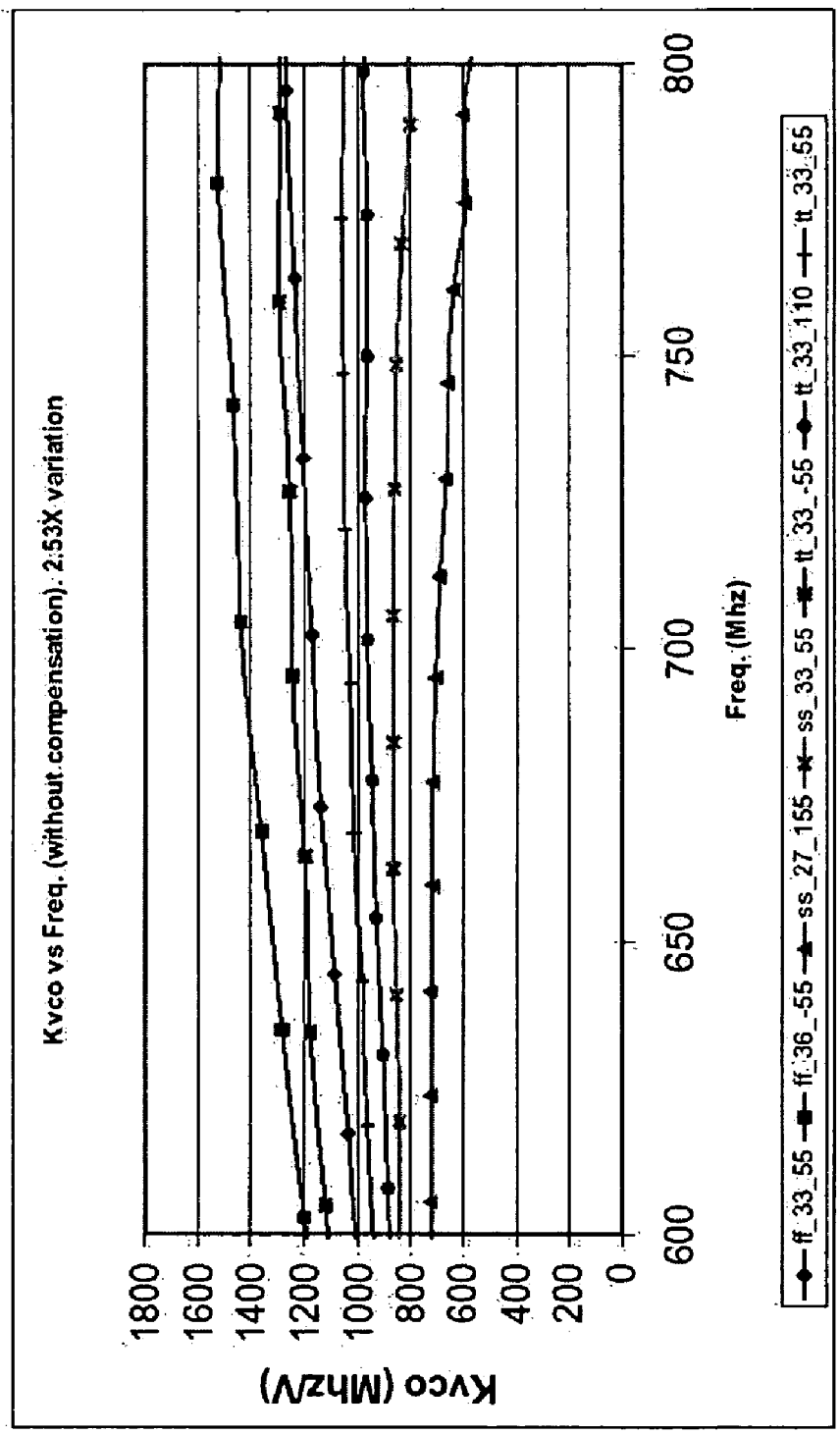
Figure 5D:
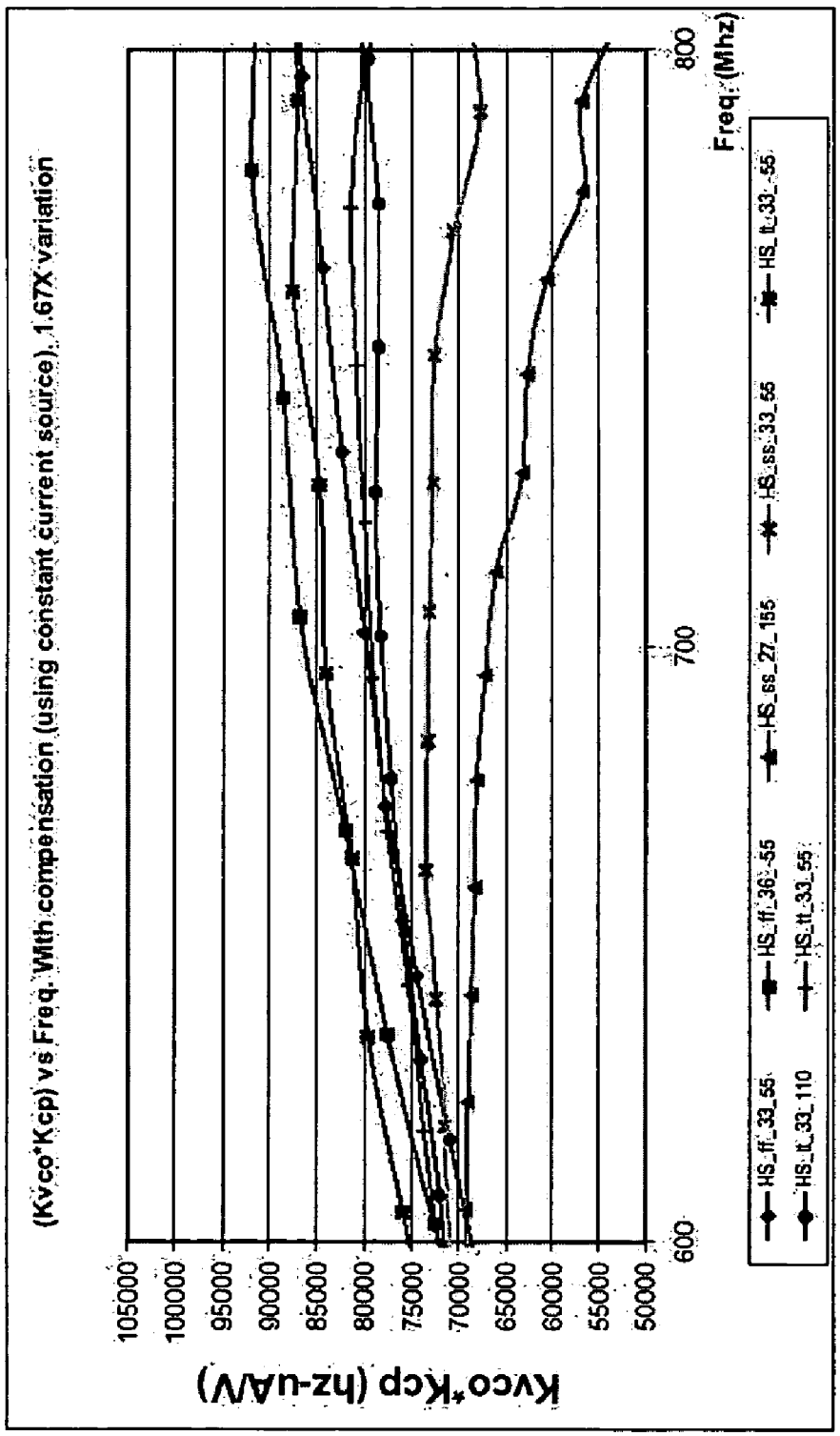

FIG. 5C shows the simulated VCO gain (Kvco) of a conventional PLL without compensation across PVT. In this example, the VCO gain is simulated at seven corners. The variation of the VCO gain is approximately 2.53×. FIG. 5D shows the simulated total gain (i.e., the product of the average current, Kcp, and Kvco) of an exemplary embodiment of a PLL with PVT compensation using a substantially constant current source. Again, the simulation is performed across PVT at seven corners. The variation of the gain is narrowed down to 1.67×.

Figure 5E:
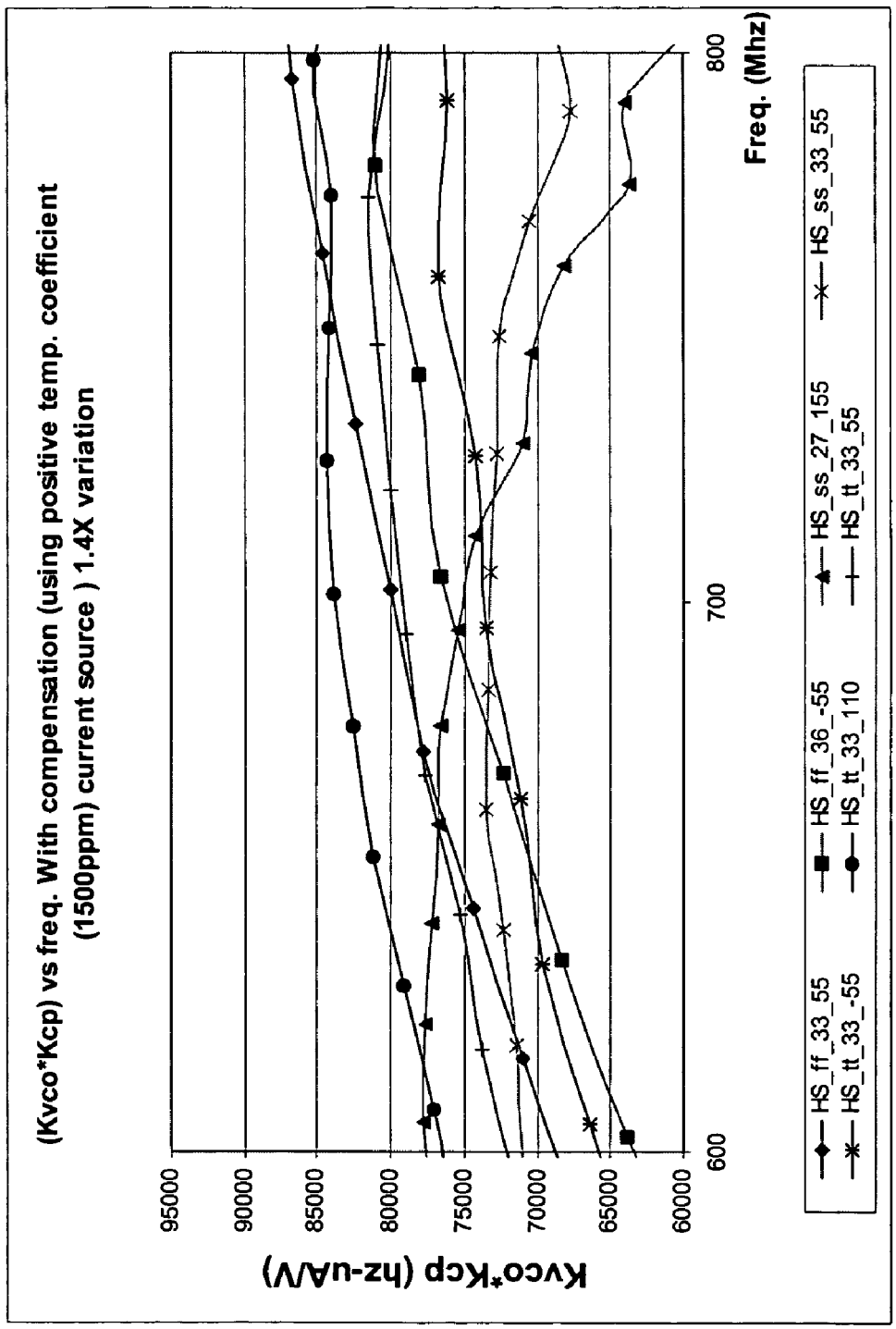

In one embodiment, a current source having a higher temperature coefficient provides better compensation to further narrow down the VCO gain variation. FIG. 5E shows the simulated total gain of an exemplary embodiment of a PLL having a substantially constant current source with a positive temperature coefficient (e.g., about 1500 ppm) in the bias circuit. Again, the simulation is performed across PVT at seven corners. As shown in FIG. 5E, the variation of the total gain is further narrowed down to 1.4×.

Figure 6:
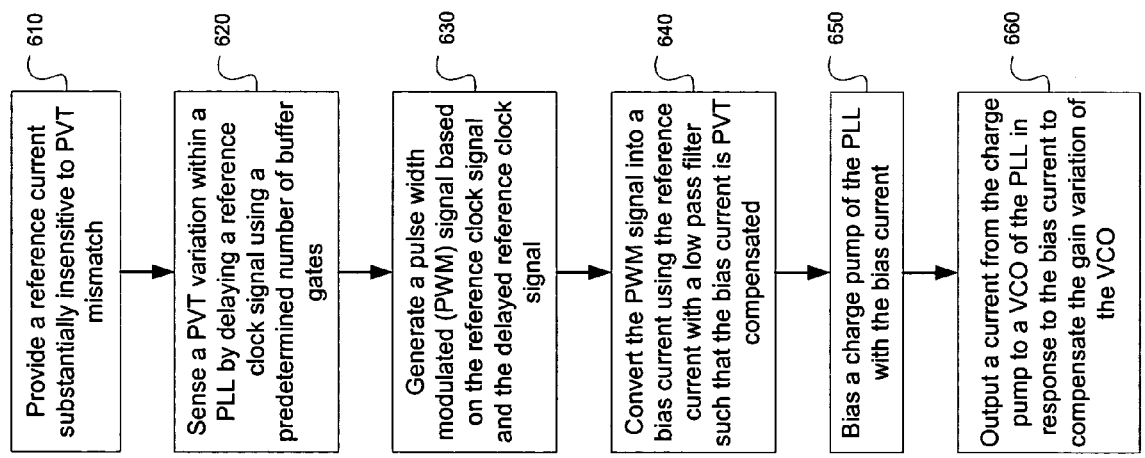
FIG. 6 shows one embodiment of a process to bias a charge pump in a PLL to compensate variation in a gain of a VCO of the PLL.

FIG. 6 shows one embodiment of a process to compensate VCO gain in a PLL. The process is performed by processing logic that may comprise hardware (e.g., circuitry, dedicated logic, etc.), software (such as is run on a general-purpose computer system, a server, or a dedicated machine), or a combination of both.

Referring to FIG. 6, processing logic provides a reference current substantially insensitive to PVT mismatch (processing block 610). Processing logic senses the PVT mismatch within a PLL by delaying a reference clock signal using a predetermined number of buffer gates (processing block 620). Processing logic then generates a PWM signal based on the reference clock signal and the delayed reference clock signal (processing block 630). The PWM signal substantially correlates with the PVT mismatch. Processing logic converts the PWM signal into a bias current using the reference current with a LPF such that the bias current is PVT compensated (processing block 640). Processing logic then biases a charge pump of the PLL with the bias current to provide PVT compensation to the charge pump (processing block 650). Processing logic outputs a current from the charge pump to a VCO of the PLL in response to the bias current to compensate the gain variation of the VCO caused by PVT mismatch (processing block 660).

Figure 7:
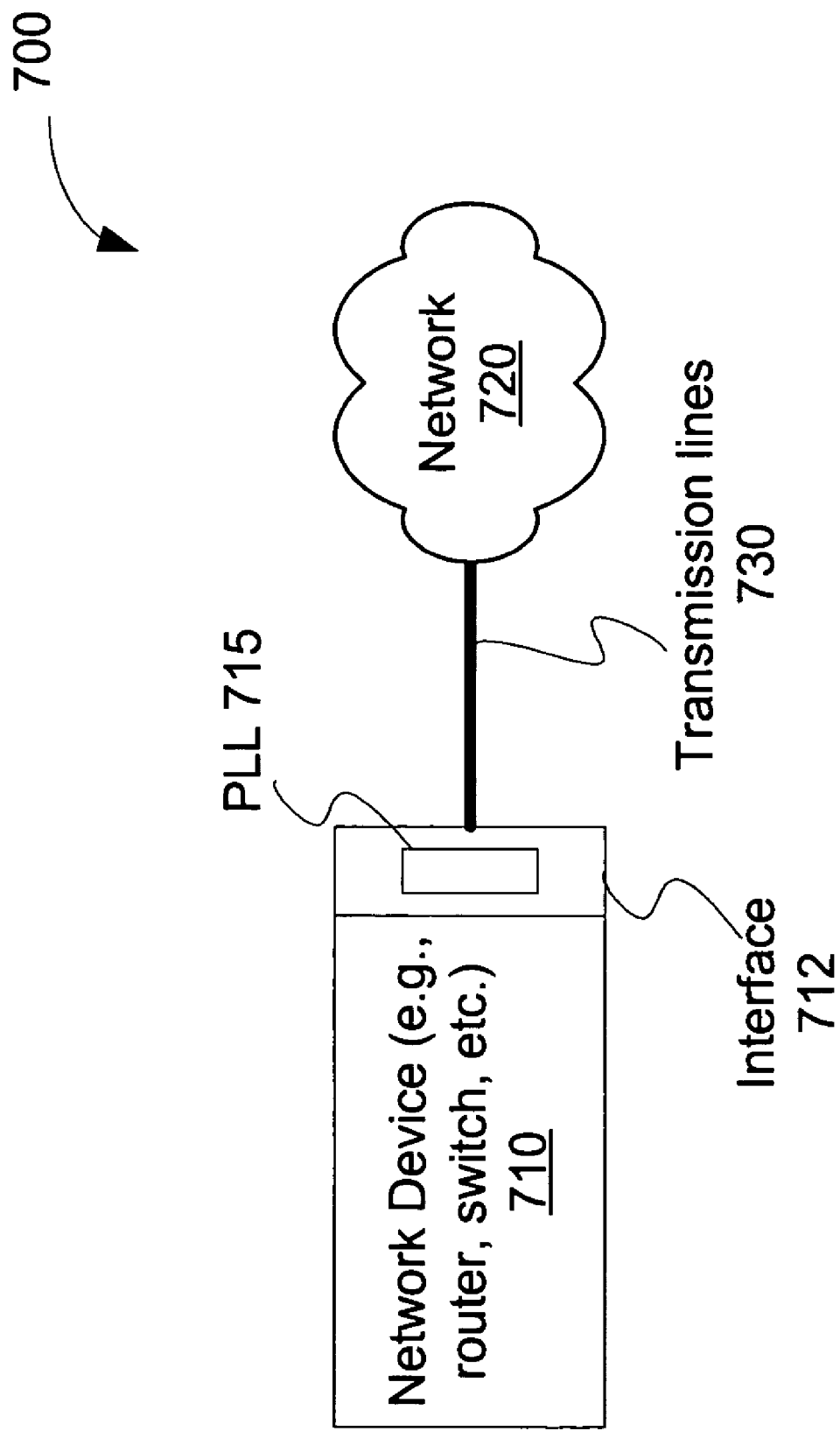
FIG. 7 shows one embodiment of a networked system.

FIG. 7 illustrates one embodiment of a networked system 700 usable with one embodiment of the PLL. The system 700 includes a networked device 710, transmission lines 730, and a network 720. The networked device 710 further includes an interface 712 having a PLL 715. The transmission lines 730 couple the networked device 710 via the interface 712 to the network 720. Signals may propagate between the network device 710 and the network 720 across the transmission lines 730. When the interface 712 of the networked device 710 receives signals from the network 720, the PLL 715 may recover data received from the network 720. Alternatively, the PLL 715 may multiply the transmit clock signal to transmit data across the transmission lines 730. Exemplary embodiments of the PLL 715 have been discussed above with reference to FIG. 2.

Note that any or all of the components of the system 700 and associated hardware may be used in various embodiments of the present invention. However, it can be appreciated that other configurations of the systems may include additional or fewer components than those illustrated in FIG. 7.

The foregoing discussion merely describes some exemplary embodiments of the present invention. One skilled in the art will readily recognize from such discussion, the accompanying drawings, and the claims that various modifications can be made without departing from the spirit and scope of the appended claims. The description is thus to be regarded as illustrative instead of limiting.

What is claimed is:

1. An apparatus, comprising:
a phase locked loop (PLL) comprising a charge pump, the charge pump comprising an input and an output; and
a bias circuit coupled to the input of the charge pump, the bias circuit comprising:
a sensor circuit to sense a temperature and at least one of a voltage and a process variation, the sensor circuit comprising:
at least one buffer gate coupled to each other in series to delay a reference clock signal, and
an exclusive-OR (XOR) gate comprising a first input, a second input, and an output, the first input to receive the delayed reference clock signal, the second input to receive the reference clock signal;
a current reference circuit coupled to the sensor circuit;
a pull-up transistor driven by the current reference circuit to provide a reference current substantially insensitive to the temperature, the voltage, and the process variation; and
a pull-down transistor coupled to the pull-up transistor, the pull-down transistor being driven by the output of the XOR gate of the sensor circuit.

2. The apparatus of claim 1, wherein the bias circuit further comprises:
a low pass filter (LPF) coupled between the pull-down transistor and the input of the charge pump to output a bias current to the charge pump.

3. The apparatus of claim 1, wherein the output of the XOR gate is a pulse width modulated (PWM) signal correlated with the temperature, the voltage, and the process variation.

4. The apparatus of claim 1, further comprising:
a loop filter comprising an input and an output, the input of the loop filter being coupled to the output of the charge pump; and
a voltage controlled oscillator (VCO) comprising an input, the input of the VCO being coupled to the output of the loop filter.

5. The apparatus of claim 1, wherein the charge pump comprises a transconductance cell.

6. The apparatus of claim 1, further comprising:
at least one transmission line; and
a router coupled to the at least one transmission line to receive data from the at least one transmission line, the router comprising a clock data recovery (CDR) circuit to recover the data, wherein the CDR circuit comprises the PLL and the bias circuit.

7. The apparatus of claim 1, further comprising:
at least one transmission line; and
a router coupled to the at least one transmission line to transmit data over the at least one transmission line, the router comprising a clock synthesizer, wherein the clock synthesizer comprises the PLL and the bias circuit.

8. A method, comprising:
generating a bias current with compensation for a temperature and at least one of a voltage and a process variation;
compensating gain variation of a voltage controlled oscillator (VCO) of a phase locked loop (PLL) in response to the bias current, wherein compensating the gain variation of the VCO comprises:
biasing a charge pump of the PLL with the bias current, and
outputting a current from the charge pump to the VCO in response to the bias current to compensate the gain variation of the VCO; and
sensing the temperature and at least one of the voltage and the process variation within the PLL, wherein sensing the temperature and at least one of the voltage and the process variation comprises:
delaying a reference clock signal using a predetermined number of buffer gates, wherein a delay of the reference clock signal is associated with the temperature and at least one of the voltage and the process variation within the PLL.

9. The method of claim 8, wherein sensing the temperature and at least one of the voltage and the process variation further comprises:

generating a pulse width modulated (PWM) signal based on the reference clock signal and the delayed reference clock signal.

10. The method of claim 9, further comprising:
providing a reference current substantially insensitive to the temperature, the voltage, and the process variation.

11. The method of claim 10, wherein generating the bias current comprises:
converting the PWM signal into the bias current using the reference current with a low pass filter.

12. An apparatus, comprising:
means for generating a bias current with compensation for a temperature and at least one of a voltage and a process variation;
means for compensating gain variation of a voltage controlled oscillator (VCO) of a phase locked loop (PLL) in response to the bias current, wherein the
means for compensating the gain variation of the VCO comprises:
means for biasing a charge pump of the PLL with the bias current, and means for outputting a current from the charge pump to the VCO in response to the bias current to compensate the gain variation of the VCO; and
means for sensing the temperature and at least one of the voltage and the process variation within the PLL, wherein the means for sensing the temperature and at least one of the voltage and the process variation comprises:
means for delaying a reference clock signal using a predetermined number of buffer gates, wherein a delay of the reference clock signal is associated with the temperature and at least one of the voltage and the process variation within the PLL.

13. The apparatus of claim 12, wherein the means for sensing the temperature and at least one of the voltage and the process variation further comprises:
means for generating a pulse width modulated (PWM) signal based on the reference clock signal and the delayed reference clock signal.

14. The apparatus of claim 13, further comprising:
means for providing a reference current substantially insensitive to the temperature, the voltage, and the process variation.

15. The apparatus of claim 14, wherein the means for generating the bias current comprises:
means for converting the PWM signal into the bias current using the reference current with a low pass filter.

* * * * *